(12) United States Patent
Weber et al.

(10) Patent No.: US 11,788,912 B2
(45) Date of Patent: Oct. 17, 2023

(54) MICROMECHANICAL PRESSURE SENSOR DEVICE INCLUDING A DIAPHRAGM SYSTEM AND CORRESPONDING MANUFACTURING METHOD

(71) Applicant: Robert Bosch GmbH, Stuttgart (DE)

(72) Inventors: Heribert Weber, Nuertingen (DE); Peter Schmollngruber, Aidlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 364 days.

(21) Appl. No.: 16/972,588

(22) PCT Filed: Jun. 28, 2019

(86) PCT No.: PCT/EP2019/067328
§ 371 (c)(1),
(2) Date: Dec. 5, 2020

(87) PCT Pub. No.: WO2020/011559
PCT Pub. Date: Jan. 16, 2020

(65) Prior Publication Data
US 2021/0215559 A1 Jul. 15, 2021

(30) Foreign Application Priority Data

Jul. 10, 2018 (DE) .......................... 102018211330.0

(51) Int. Cl.
*G01L 9/00* (2006.01)
*B81B 3/00* (2006.01)
(Continued)

(52) U.S. Cl.
CPC .......... *G01L 9/0048* (2013.01); *B81B 3/0021* (2013.01); *B81C 1/00182* (2013.01);
(Continued)

(58) Field of Classification Search
None
See application file for complete search history.

(56) References Cited

U.S. PATENT DOCUMENTS 5,332,469 A 7/1994 Mastrangelo
5,450,754 A 9/1995 Biebl et al.
(Continued)

FOREIGN PATENT DOCUMENTS

CH 680392 A5 8/1992
CN 104773705 A 7/2015
(Continued)

OTHER PUBLICATIONS

International Search Report for PCT/EP2019/067328, dated Sep. 4, 2019.

*Primary Examiner* — Octavia Davis Hollington
*Assistant Examiner* — Jermaine L Jenkins
(74) *Attorney, Agent, or Firm* — NORTON ROSE FULBRIGHT US LLP; Gerard Messina

(57) ABSTRACT

A micromechanical pressure sensor device and a corresponding manufacturing method. The micromechanical pressure sensor device is equipped with a sensor substrate; a diaphragm system that is anchored in the sensor substrate and that includes a first diaphragm and a second diaphragm situated spaced apart therefrom, which are circumferentially connected to one another in an edge area and enclose a reference pressure in an interior space formed in between; and a plate-shaped electrode that is suspended in the interior space and that is situated spaced apart from the first diaphragm and from the second diaphragm and forms a first capacitor with the first diaphragm and forms a second capacitor with the second diaphragm. The first diaphragm
(Continued)

and the second diaphragm are designed in such a way that they are deformable toward one another when acted on by an external pressure.

15 Claims, 18 Drawing Sheets

(51) Int. Cl.
*B81C 1/00* (2006.01)
*G01L 19/14* (2006.01)

(52) U.S. Cl.
CPC ............ *G01L 9/005* (2013.01); *G01L 9/0073* (2013.01); *G01L 19/145* (2013.01); *B81B 2201/0264* (2013.01); *B81B 2203/0118* (2013.01); *B81B 2203/0127* (2013.01); *B81B 2203/0163* (2013.01); *B81B 2203/0307* (2013.01); *B81B 2203/04* (2013.01); *B81C 2201/013* (2013.01); *B81C 2201/0105* (2013.01)

(56) References Cited

U.S. PATENT DOCUMENTS

| | | | |
|---|---|---|---|
| 5,631,428 A | 5/1997 | Catanescu et al. | |
| 6,159,762 A | 12/2000 | Scheiter et al. | |
| 7,353,711 B2 | 4/2008 | O'Dowd et al. | |
| 8,402,836 B2 * | 3/2013 | Dannhauer | G01L 19/0609 |
| | | | 73/736 |
| 8,558,327 B2 * | 10/2013 | Knese | G01L 9/0042 |
| | | | 257/414 |
| 8,779,536 B2 * | 7/2014 | Weber | B81B 3/0021 |
| | | | 257/621 |
| 2011/0100129 A1 | 5/2011 | Gruhler | |
| 2018/0172534 A1 | 6/2018 | Riou et al. | |

FOREIGN PATENT DOCUMENTS

| | | |
|---|---|---|
| CN | 105940287 A | 9/2016 |
| DE | 4227819 A1 | 2/1993 |
| DE | 102013213071 B3 | 10/2014 |
| DE | 102015103236 A1 | 9/2015 |
| DE | 102016106117 A1 | 10/2017 |

* cited by examiner

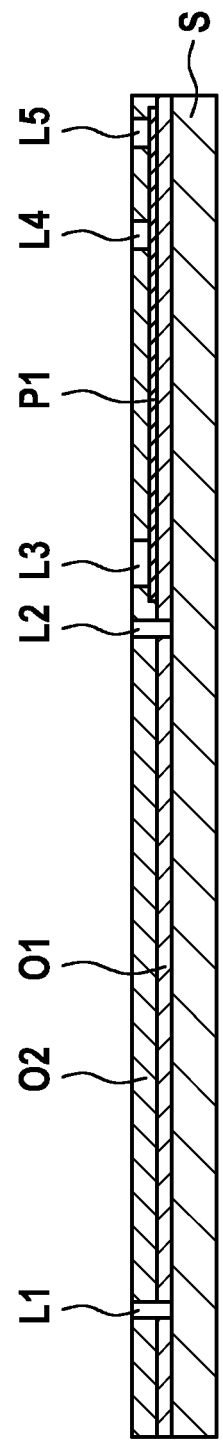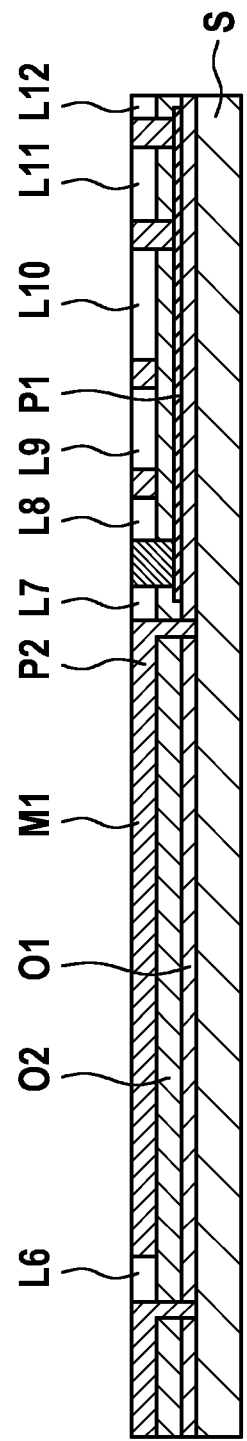

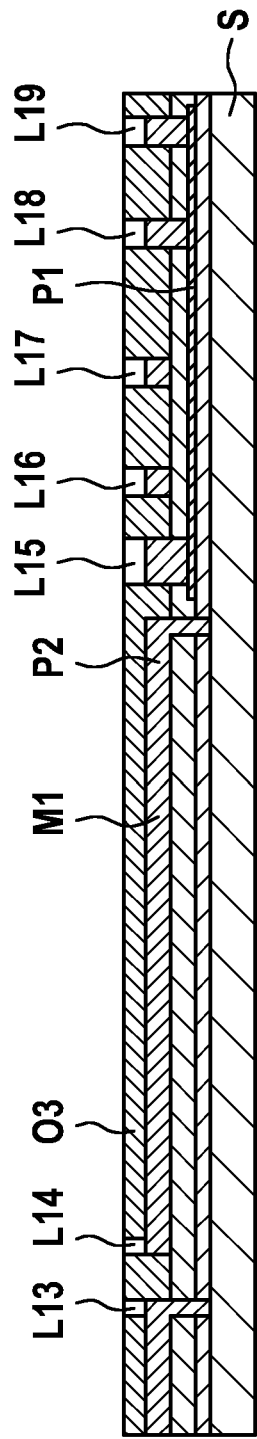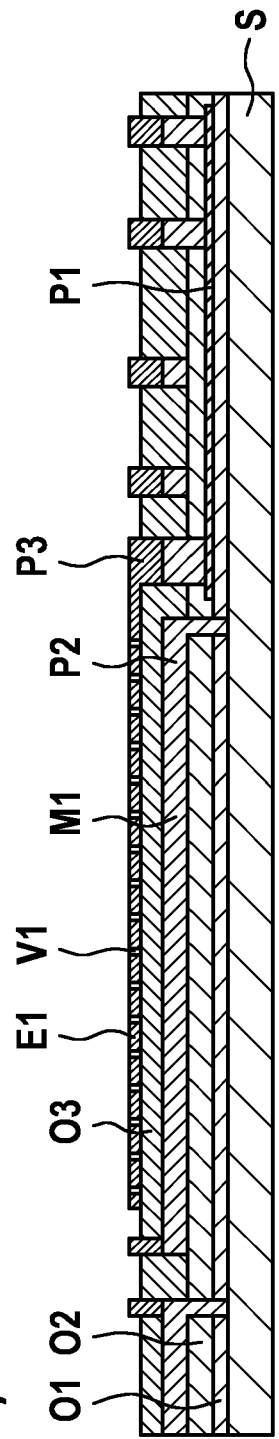

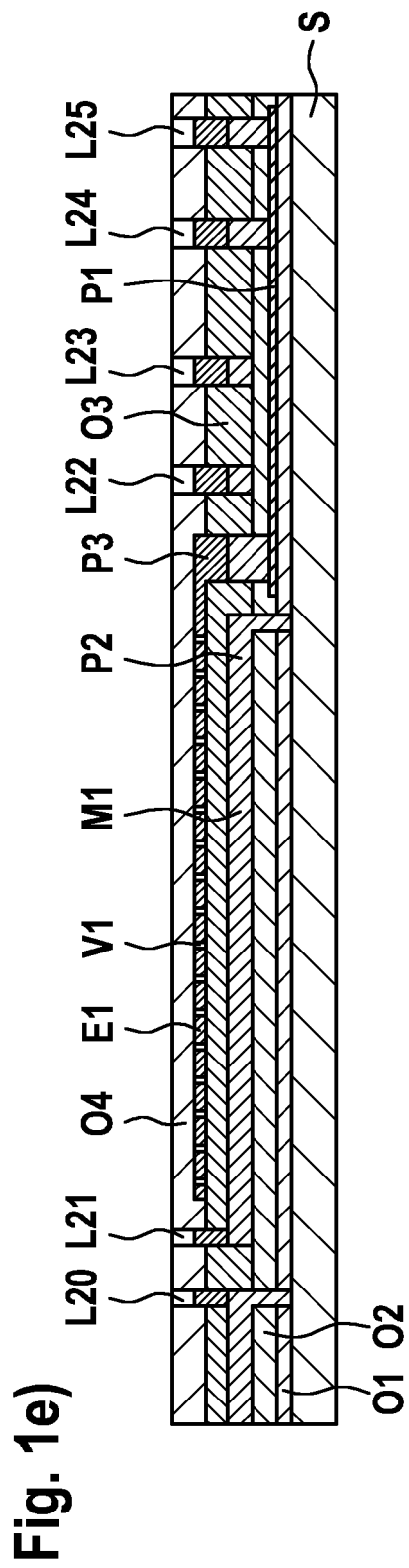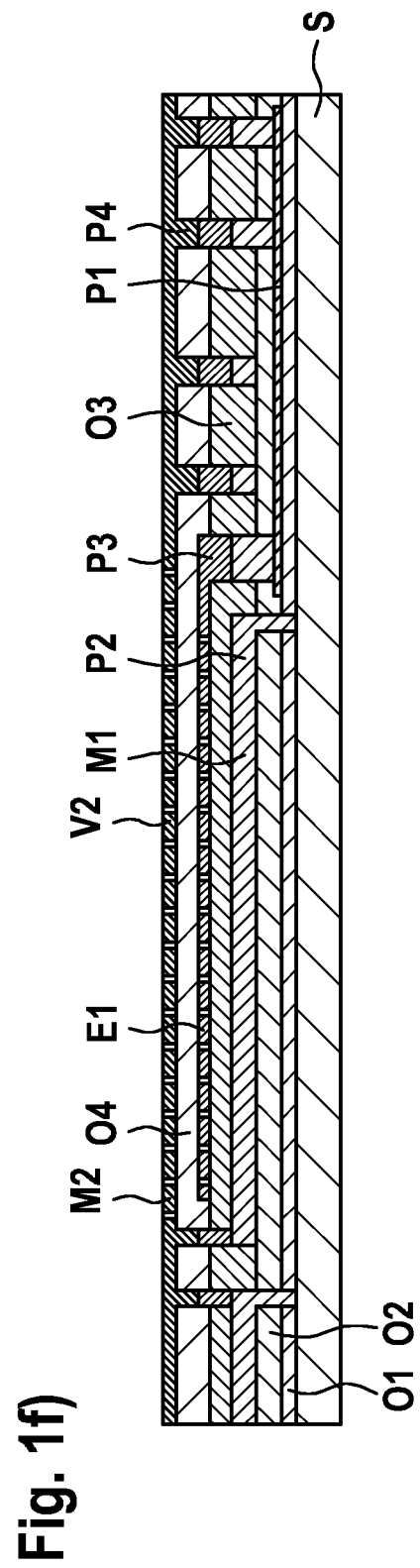

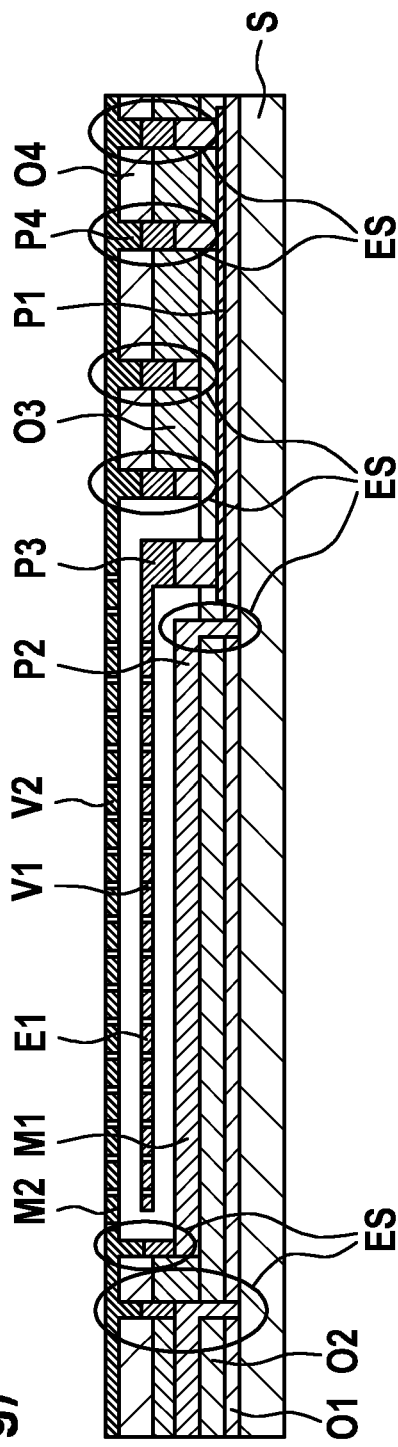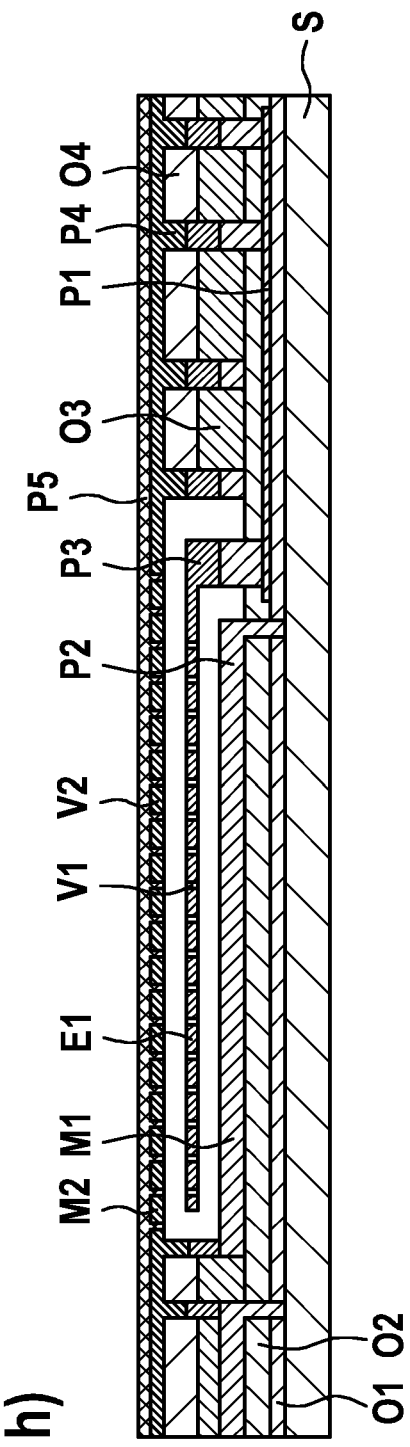

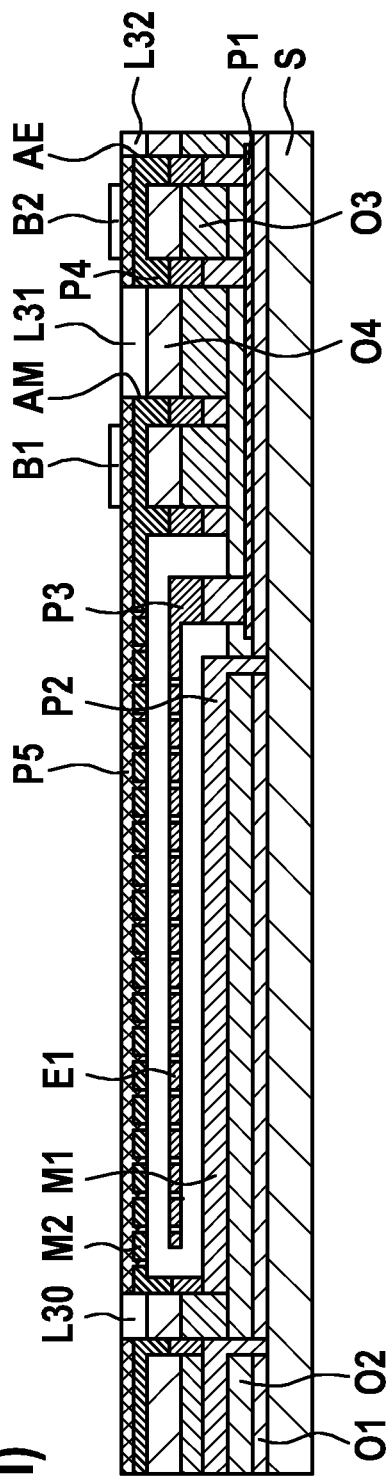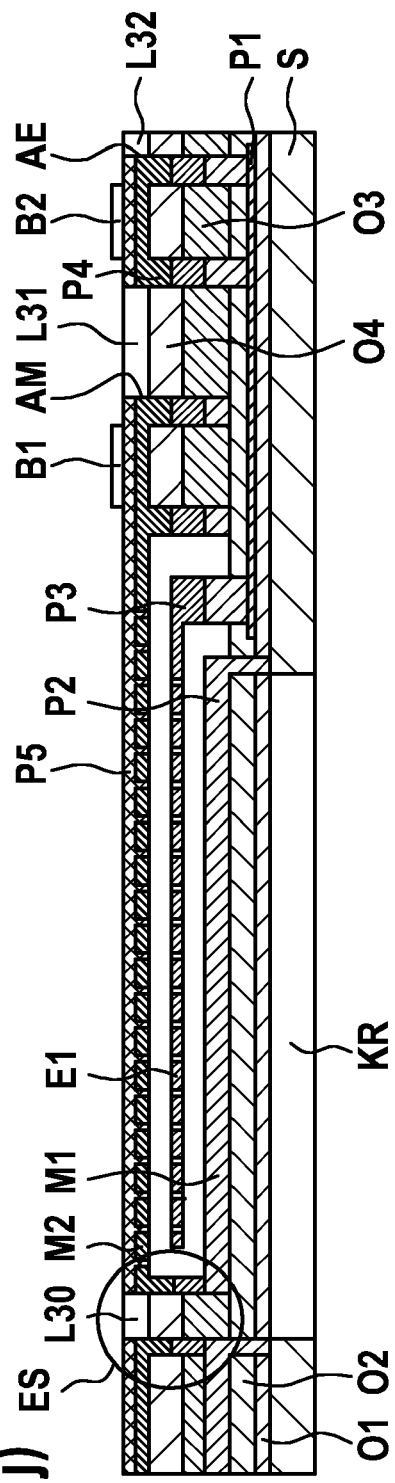

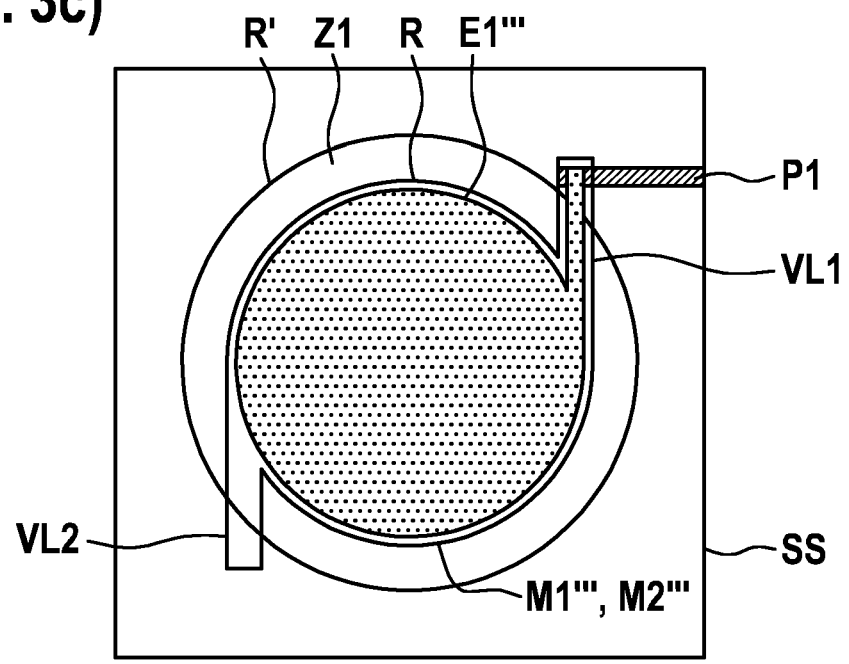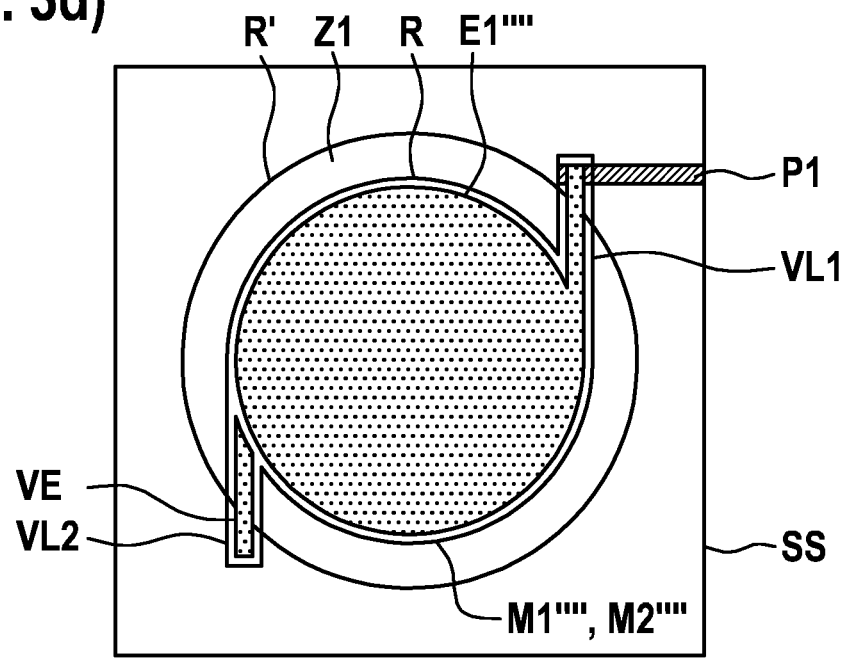

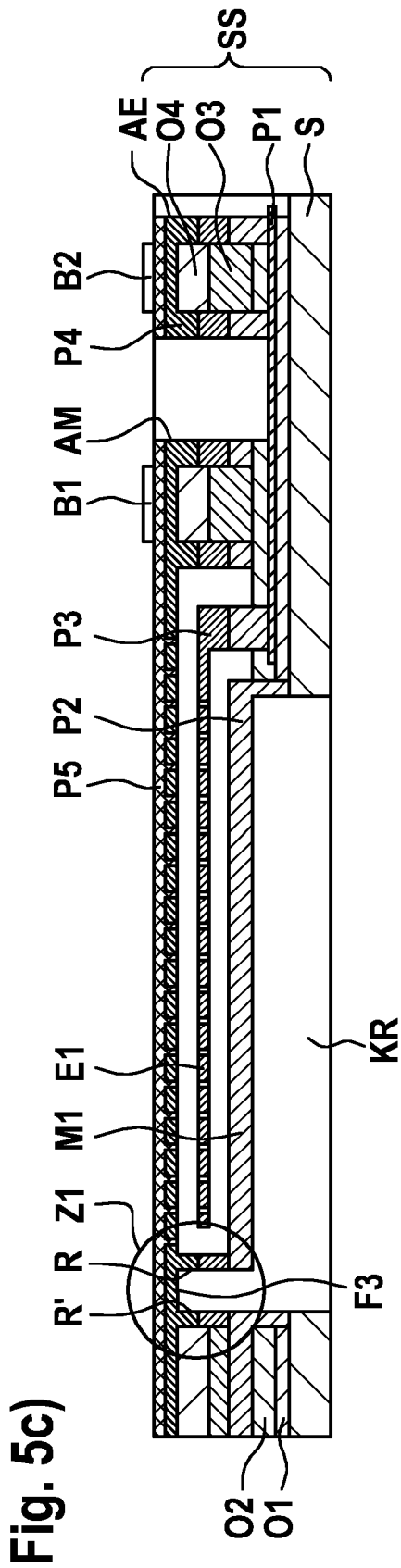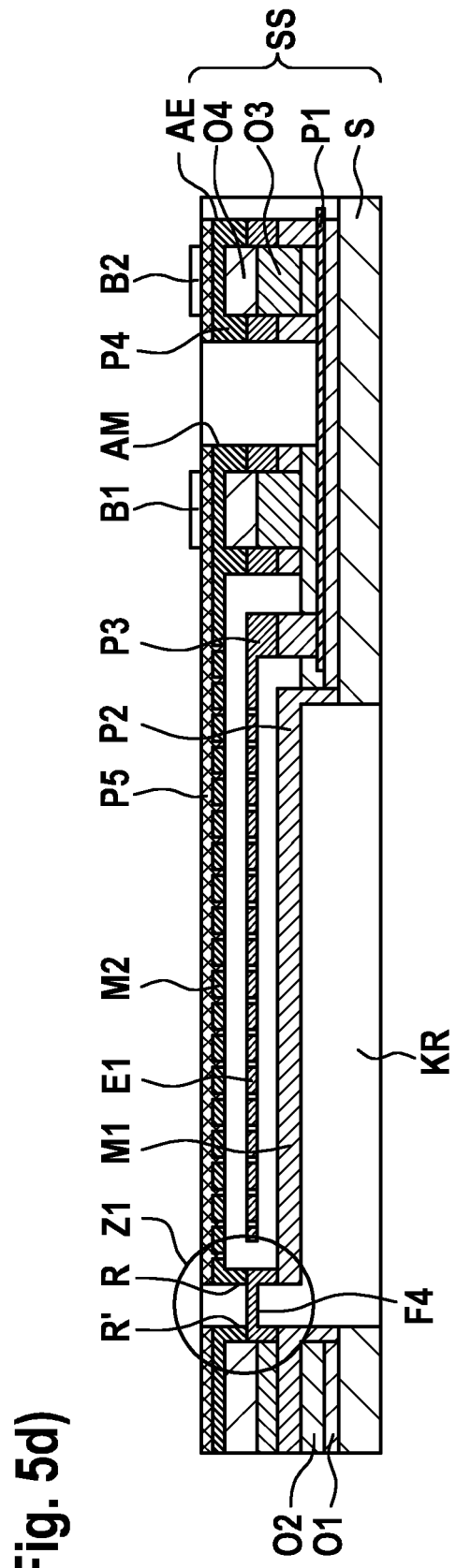

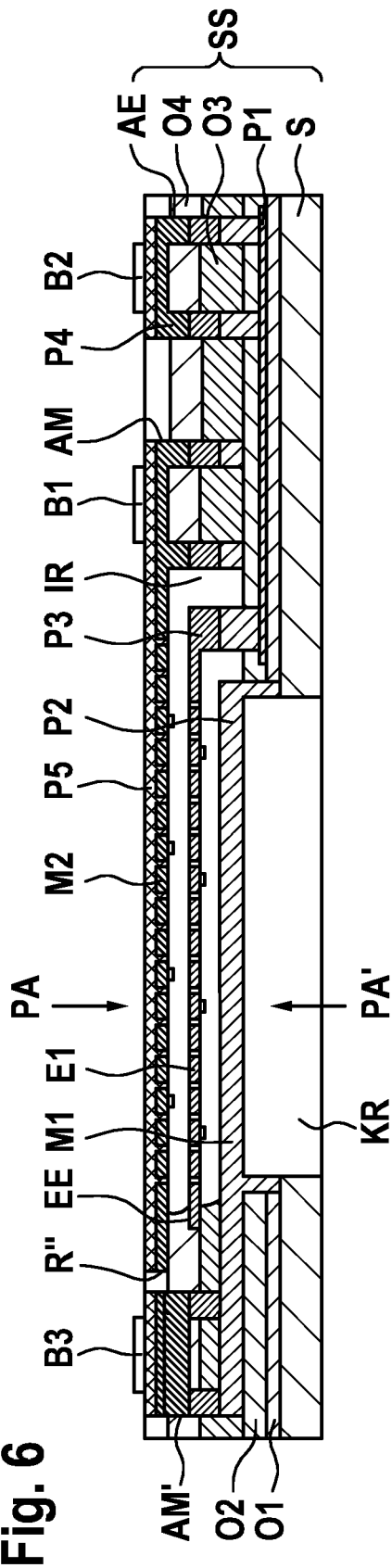

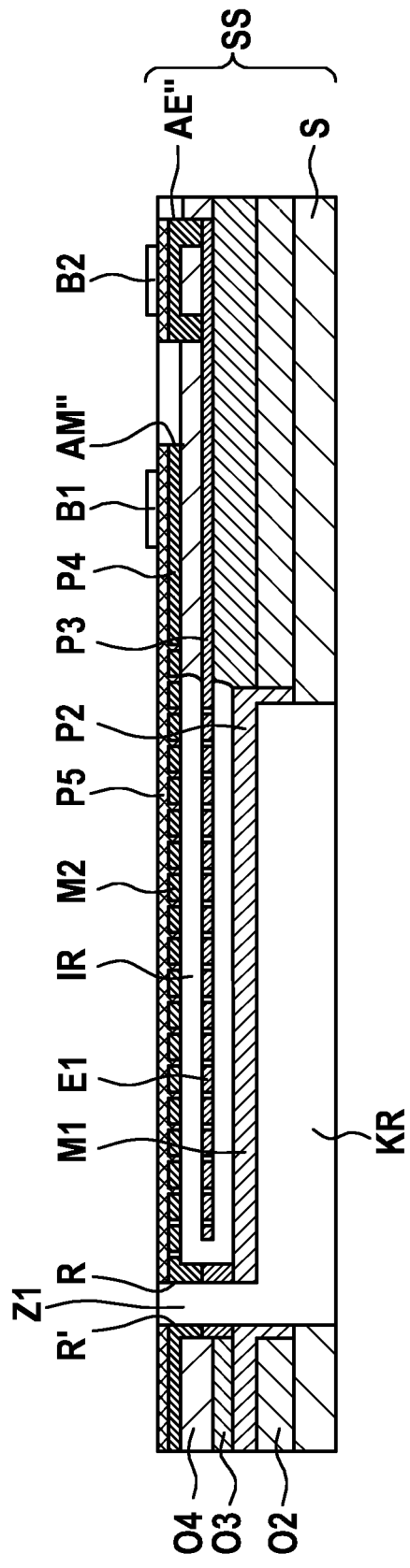

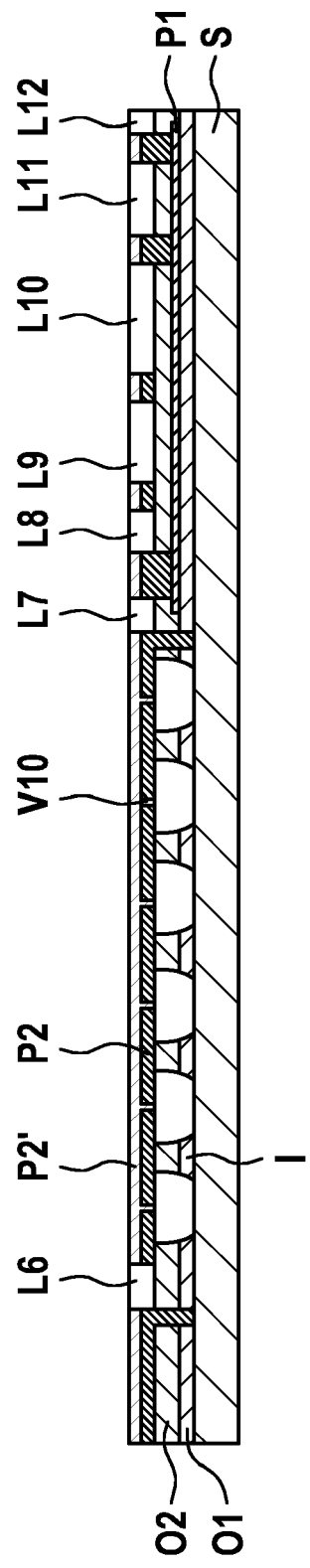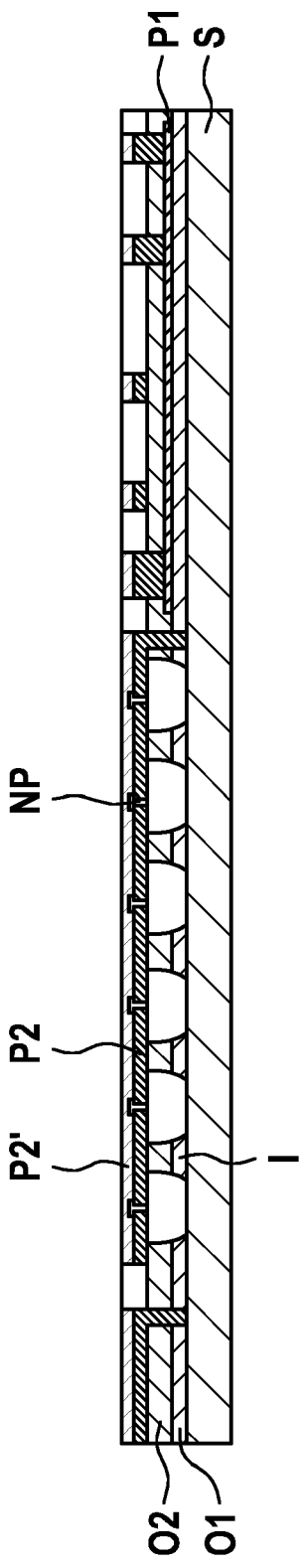

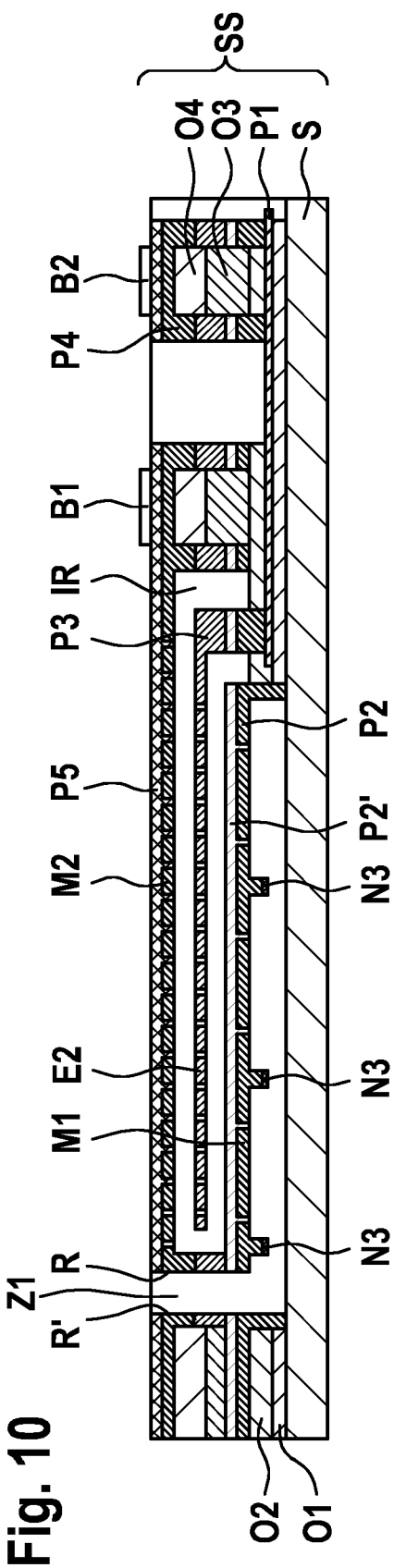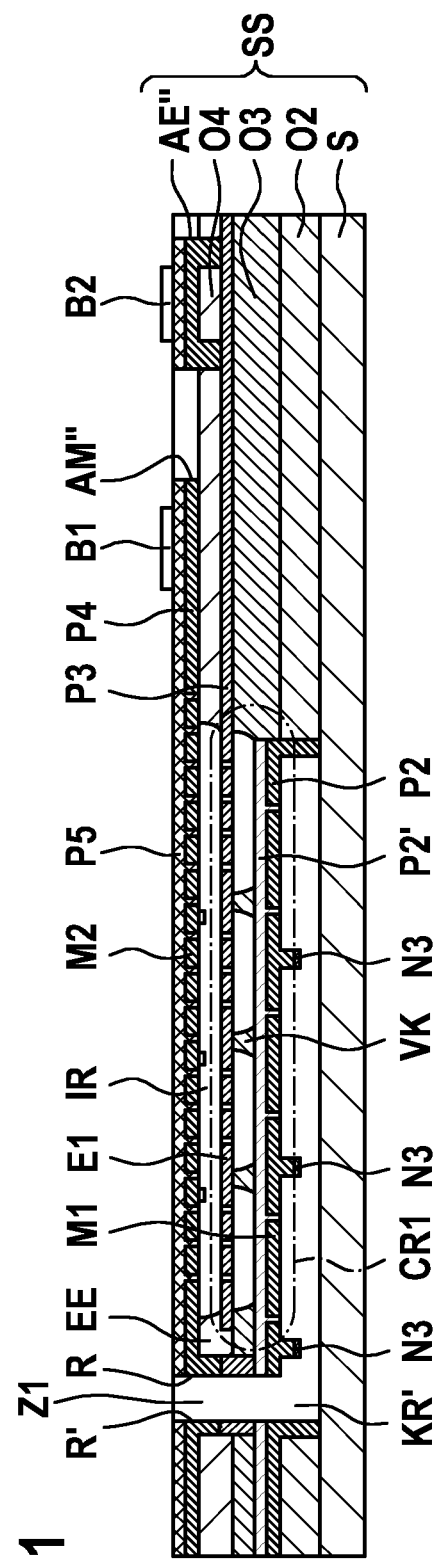

MICROMECHANICAL PRESSURE SENSOR DEVICE INCLUDING A DIAPHRAGM SYSTEM AND CORRESPONDING MANUFACTURING METHOD

FIELD

The present invention relates to a micromechanical pressure sensor device and a corresponding manufacturing method.

BACKGROUND INFORMATION

Although any micromechanical pressure sensor devices are applicable, the present invention and its underlying set of problems are explained with reference to micromechanical pressure sensor devices based on silicon.

Capacitive micromechanical pressure sensor devices that include a deformable diaphragm that is circumferentially clamped on all sides are conventional, the deflection of the diaphragm being capacitively determined with the aid of an electrode on an underlying substrate. In this type of pressure sensor device, the diaphragm and the electrode fixedly anchored on the substrate form a capacitor structure, with the aid of which a change in distance between the diaphragm and the electrode due to a pressure that acts on the diaphragm may be measured. A statement may thus be made about the pressure present at the diaphragm by determining the capacitance between the diaphragm and the electrode.

Such pressure sensor devices are generally sensitive to a stress, coupled into the diaphragm, due to the manufacturing process, for example. In addition, these pressure sensor devices are sensitive to moisture at the sensor surface, for example due to formation of undesirable stray capacitances, for which reason these pressure sensor devices must generally be operated with a gel mat on the diaphragm.

U.S. Pat. No. 5,332,469 describes a differential pressure sensor that includes a sensor capacitor and a reference capacitor that are laterally adjacently situated in a sensor substrate.

U.S. Pat. No. 6,159,762 describes a method for manufacturing a micromechanical pressure sensor device, a sacrificial layer etching process being used in order to expose a diaphragm.

U.S. Pat. No. 5,450,754 describes a pressure sensor in which an arrangement of diaphragms adjacently situated in a sensor substrate is provided.

SUMMARY

The present invention provides a micromechanical pressure sensor device and a corresponding manufacturing method.

Preferred embodiments and refinements of the present invention are described herein.

The present invention allows provision of a capacitive micromechanical pressure sensor device that has a high moisture insensitivity/resistance, and that includes a diaphragm with very good stress decoupling with respect to the surrounding sensor substrate and having a high sensitivity.

A main feature of the present invention is a cantilever or clamped diaphragm structure in which a central electrode is situated between two deformable diaphragms. The two diaphragms enclose the central electrode, thus likewise forming a pressure sensor. Both diaphragm planes contact one another outside the area of the central electrode, resulting in a structure in which the central electrode is mechanically and electrically completely enclosed by the surrounding diaphragms.

In this design, both diaphragms are deflected when acted on by pressure. As a result, with comparable diaphragm dimensions it is possible to achieve twice the change in capacitance compared to customary pressure sensor devices, in which only one diaphragm is deflected. Due to the present invention, it is thus possible, with comparable diaphragm dimensions, to achieve capacitive pressure sensors that have approximately twice the sensitivity, or that have the same sensitivity with diaphragm surfaces that are only approximately half as large. In addition, due to the cantilever and the clamping of the diaphragm structure, which is carried out only in areas or on one side, it is possible to achieve maximum stress decoupling with respect to the surrounding material of the pressure sensor device. This in turn yields the advantage that stress that is coupled into the pressure sensor device, for example due to the type of construction and joining technique, is not transmitted into the diaphragm and does not result in a deformation, which falsifies the pressure measuring result.

Due to the enclosure of the central electrode on all sides by the two diaphragms (made up of an upper diaphragm and a lower diaphragm), with a skilled design layout of the pressure sensor device it is possible to connect all media-contacting parts at the same potential, for example ground potential. This has the advantage that electrochemical reactions and stray capacitances at structures of different potentials cannot occur. Due to the special design of the diaphragm structure, it is also possible to expose the diaphragm structure directly to water or other liquids, for example, with suitable protection of the bond pads, for example by gelling. Protecting the diaphragm using a large-surface gel mat, for example, which is sometimes necessary with conventional pressure sensors, is not required.

In addition, the present invention may be carried out as an OMM or bulk silicon variant with only minor process modifications. The latter variant has advantages when the pressure sensor is exposed to media (dry/moist/wet) that frequently vary greatly (better drying behavior).

According to one preferred refinement of the present invention, the diaphragm system is situated in an essentially cantilever manner, and is anchored in the sensor substrate across at least one extension area that extends laterally away from the diaphragm system. Effective stress decoupling may be achieved in this way.

According to a further preferred refinement of the present invention, the diaphragm system has a cylindrical design, a first extension area and a second extension area being provided that extend tangentially and laterally away from the diaphragm system and that are situated diametrically opposite one another. This has the advantage that in the event of thermal expansion of the anchorings, only slight twisting of the diaphragm system, but not stress coupling, may occur.

According to a further preferred refinement of the present invention, the central electrode is situated in a cantilever manner and is anchored in the sensor substrate across the at least one extension area. Due to the cantilever anchoring, maximum stress decoupling of the central electrode with respect to the surrounding material of the pressure sensor device may be achieved.

According to a further preferred refinement of the present invention, the central electrode is clamped, at least in areas, in the interior across a clamping area. This contributes to stabilization of the central electrode.

According to a further preferred refinement of the present invention, the diaphragm system at the edge area is clamped in the sensor substrate via at least one elastic spring device. This contributes to stabilization of the diaphragm system.

According to a further preferred refinement of the present invention, the first diaphragm and the second diaphragm are electroconductively connected to one another via the edge area.

According to a further preferred refinement of the present invention, the first diaphragm and the second diaphragm are electrically insulatingly connected to one another via the edge area.

According to a further preferred refinement of the present invention, the first diaphragm is exposed to the outside toward a first side or toward a second side of the sensor substrate via a cavity, and the second diaphragm is exposed to the outside toward the second side of the sensor substrate.

According to a further preferred refinement of the present invention, the first diaphragm is connected to the central electrode across electrically insulating connecting areas, so that when the first diaphragm is acted on by the external pressure, the central electrode together with the first diaphragm is deformable, and a reference capacitor is thus formed.

According to a further preferred refinement of the present invention, the second diaphragm is connected to the central electrode via electrically insulating connecting areas, so that when the second diaphragm is acted on by the external pressure, the central electrode together with the second diaphragm is deformable, and a reference capacitor is thus formed.

According to a further preferred refinement of the present invention, a separate reference capacitor is formed in the sensor substrate, laterally spaced apart from the diaphragm system.

BRIEF DESCRIPTION OF THE DRAWINGS

Further features and advantages of the present invention are explained below based on specific embodiments, with reference to the figures.

FIG. 6 shows a schematic vertical cross-sectional illustration of a micromechanical pressure sensor device according to a fourth specific embodiment of the present invention.

FIG. 7 shows a schematic vertical cross-sectional illustration of a micromechanical pressure sensor device according to a fifth specific embodiment of the present invention.

FIG. 8 shows a schematic vertical cross-sectional illustration of a micromechanical pressure sensor device according to a sixth specific embodiment of the present invention.

FIG. 10 shows a schematic vertical cross-sectional illustration of a micromechanical pressure sensor device according to an eighth specific embodiment of the present invention.

FIG. 11 shows a schematic vertical cross-sectional illustration of a micromechanical pressure sensor device according to a ninth specific embodiment of the present invention.

DETAILED DESCRIPTION OF EXAMPLE EMBODIMENTS

Figure 1K:
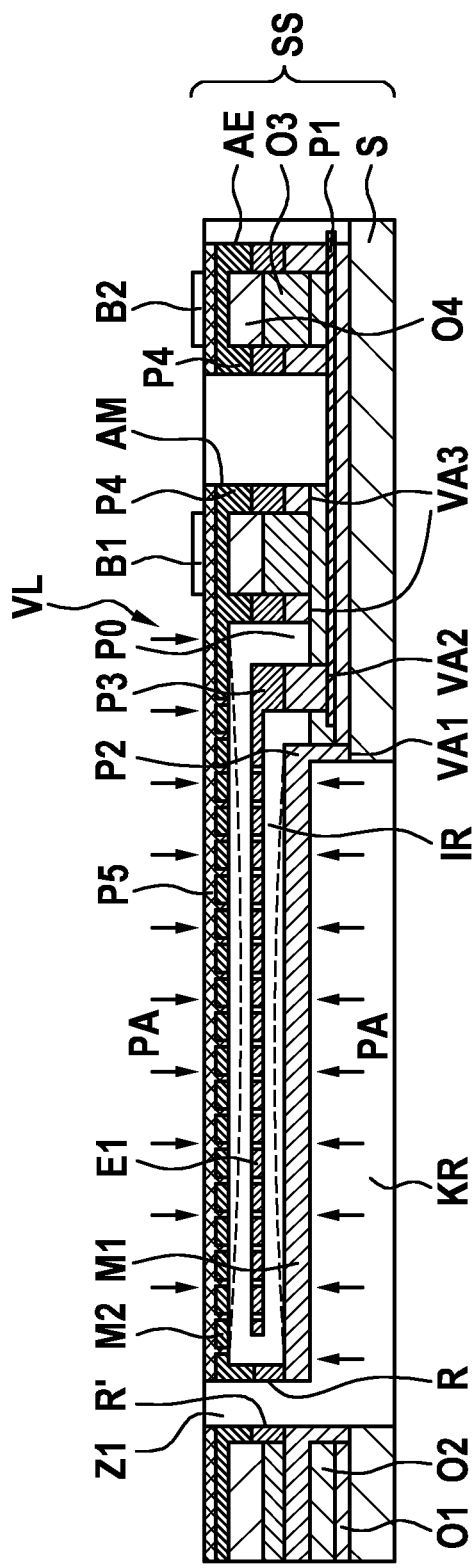
FIGS. 1a) through 1k) show schematic vertical cross-sectional illustrations for explaining a method for manufacturing a micromechanical pressure sensor device, and a corresponding micromechanical pressure sensor device according to a first specific embodiment of the present invention.

Identical or functionally equivalent elements are denoted by the same reference symbols in the figures.

FIGS. 1a) through 1k) are schematic vertical cross-sectional illustrations for explaining a method for manufacturing a micromechanical pressure sensor device, and a corresponding micromechanical pressure sensor device according to a first specific embodiment of the present invention.

According to FIG. 1a), a first insulating layer O1, for example a silicon oxide layer, is formed or deposited on a base substrate S, for example a silicon substrate. A first conductive layer P1, for example a polysilicon layer, is deposited on first insulating layer O1, which may take place via an LPCVD process, for example. First conductive layer P1 is subsequently structured in such a way that strip conductor structures or other structures result.

A second insulating layer O2, for example a silicon oxide layer, is subsequently deposited on this layer combination. First insulating layer O1 and second insulating layer O2 are structured via a standard etching process, for example plasma etching or wet etching, in a subsequent process step. It is advantageous to select an etching process that has a high etching selectivity with respect to first conductive layer P1 and with respect to base substrate S, i.e., with respect to silicon in the present case. During the structuring of first and second insulating layers O1, O2, holes L1 through L5 are formed which are used for connecting subsequent layer P2 to corresponding underlying layers, i.e., in the present case, holes L1, L2 for connecting to base substrate S, and holes L3, L4, L5 for connecting to first conductive layer P1.

After the structuring of first and second insulating layers O1, O2, according to FIG. 1b) a second conductive layer P2, for example a polysilicon layer, is deposited and structured above the structure according to FIG. 1a). This second conductive layer P2 is used on the one hand for generating lateral etch stop structures ES (see FIGS. 1g) and 1j)), and on the other hand for electrically connecting first conductive layer P1, and ultimately also for creating a lower first diaphragm M1.

During the structuring of second conductive layer P2, holes L6 through L12 are formed which are to be filled with a third insulating layer O3 in a subsequent process step.

Depending on the application, it may be advantageous for second conductive layer P2 to have a thickness of several microns. To achieve this, in the present example a further polysilicon layer could be epitaxially applied to second conductive layer P2 made of polysilicon, and at the same time could be structured with underlying second conductive layer P2. This optional epitaxially applied further polysilicon layer may also be produced from multiple individual depositions in order to minimize an influence on the layer stress and the subsequent bending of first diaphragm M1.

Furthermore, with reference to FIG. 1c), a third insulating layer O3 is deposited and structured on structured second conductive layer P2. During the structuring of third insulating layer O3, holes L13 through L19 are formed which on the one hand are used for further formation of lateral etch stop structures ES (L13 and L14), and on the other hand for forming electrical contacting structures (L15 through L19).

As illustrated in FIG. 1d), after the structuring of third insulating layer O3 the deposition and structuring of a third conductive layer P3, for example likewise a polysilicon layer, takes place. During the structuring, etch stop structures ES and the electrical contact structures are continued. In particular, a central electrode E1 is formed from third conductive layer P3. Here as well, the formation of third conductive layer P3 may optionally include a thickening with the aid of further epitaxially applied polysilicon layers. Etching holes V1 are provided in central electrode E1, which are subsequently intended to allow removal of third insulating layer O3 below central electrode E1. How and where etch fronts meet upon removal of the insulating layer and how locally the removal of insulating layer O3 takes place may be further influenced via the position of etching holes V1. It is thus possible to control the subsequent exposure of central electrode E1 in a targeted manner.

As illustrated in FIG. 1e), a fourth insulating layer O4, likewise made of silicon oxide, for example, is deposited and structured on structured third conductive layer P3 and exposed third insulating layer O3. During the structuring, holes L20 through L25 are formed which are used for continuing lateral etch stop structures ES (L20, L21) and for continuing electrical contacts (L22 through L25).

With reference to FIG. 1f), a fourth conductive layer P4, likewise made of polysilicon, for example, is subsequently deposited on structured fourth insulating layer O4.

Fourth conductive layer P4 is likewise used to continue etch stop structures ES and electrical contacts, and also to produce an upper second diaphragm M2. The same as for conductive layers P2 and P3 described above, fourth conductive layer P4 may also be thickened with the aid of further epitaxially applied polysilicon layers.

Within second diaphragm M2, once again etching holes V2 are provided which allow undercutting of second diaphragm M2 and of central electrode E1 with the aid of standard processes, such as HF gas phase etching, in order to remove third insulating layer O3 and fourth insulating layer O4 in the area in question.

The undercutting step is shown in FIG. 1g). As a result of the undercutting step, a cantilever central electrode E1 is obtained in a space that is delimited essentially by first diaphragm M1, second diaphragm M2, and lateral etch stop structures ES.

A fifth conductive layer P5, likewise made of polysilicon, for example, is deposited above fourth conductive layer P4 in a subsequent process step shown in FIG. 1h), as the result of which etching holes V2 are closed, and interior IR (see FIG. 1k)), in which central electrode E1 is situated, is thus closed. A predetermined reference pressure P0 may be enclosed in interior IR in this step, as explained in greater detail below. Optionally, it is possible to thicken fifth conductive layer P5 via further epitaxially applied polysilicon layers (see above).

To avoid the formation of possible short circuits between second diaphragm M2 and central electrode E1, in this step it may be advantageous to achieve the closure of etching holes V2 by depositing an insulating layer made of silicon oxide and/or silicon nitride, for example, and/or by depositing an epitaxial polysilicon layer.

If an insulating layer or a combination of insulating layers is used as a closure layer for etching holes V2, it may be structured or planarized afterwards and covered across the entire surface with fifth conductive layer P5 made of polysilicon.

In particular etching holes having small lateral dimensions in upper diaphragm M2 are advantageous as etching holes V2, since due to the high deposition rate during application of an epitaxial polysilicon layer, these etching holes may be quickly closed and short circuits are thus easily avoidable. Etching holes having small lateral dimensions are also advantageous during closure of etching holes V2 with an insulating layer, since a quick closure of the holes may take place and a mechanical connection between diaphragm M2 and central electrode E1 may be avoided.

As shown in FIG. 1i), after etching holes V2 are closed a deposition and structuring of a bond pad metal plating, made of aluminum, for example, takes place to form bond pads B1, B2. Fourth and fifth conductive layers P4, P5 may then also be structured in this process step or a subsequent process step in order to form holes L30, L31, and L32 in areas that are necessary for subsequent exposure of the diaphragm system including first and second diaphragms M1, M2, or that are necessary for exposing an electrical connection AE of central electrode E1 and an electrical connection AM of second diaphragm M2.

With reference to FIG. 1j), trench etching of base substrate S now takes place from the side of base substrate S in the area of the diaphragm system including first and second diaphragms M1, M2, in order to provide a cavity KR. However, this trench etching step is optional.

Lastly, with reference to FIG. 1k), after the optional formation of cavity KR below the diaphragm system including first and second diaphragms M1, M2, a removal of exposed first through fourth insulating layers O1, O2, O3, O4 in the area of etch stop structures ES, a removal of first and second insulating layers O1, O2 below diaphragm system M1, M2, and optionally a removal of second, third, and fourth insulating layers O2, O3, O4 within holes L31, L32 in the area of electrical connections AE, AM take place. This may likewise be achieved with the aid of standard processes such as HF gas phase etching, wet etching, or also plasma etching.

Lateral etch stop structures ES help to ensure that only precisely defined silicon oxide areas of first through fourth insulating layers O1 through O4 in the layer combination are removed.

Thus, FIG. 1k) shows the completed micromechanical pressure sensor device according to the first specific embodiment, this being an absolute pressure sensor device that is designed to detect an external pressure PA that is present within interior IR of diaphragm system M1, M2 with respect to reference pressure P0.

Diaphragm system M1, M2 including first diaphragm M1 and second diaphragm M2 is situated essentially in a cantilever manner, and is anchored in sensor substrate SS only across an extension area VL that extends laterally away from diaphragm system M1, M2, sensor substrate SS denoting the entire system illustrated in FIG. 1k). The anchoring areas are denoted by reference symbols VA1, VA2, VA3, first anchoring area VA1 involving an electrical connection to base substrate S, second anchoring area VA2 forming an electrical connection to first conductive layer P1, and third anchoring area VA3 forming a mechanical, electrically insulated connection to second insulating layer O2.

First diaphragm M1 and second diaphragm M2 are circumferentially connected to one another and likewise electroconductively connected to one another in an edge area R, so that they are at the same electrical potential and therefore form a folded capacitor system with plate-shaped central electrode E1 which is suspended in interior IR, and which is suspended spaced apart from first diaphragm M1 and from second diaphragm M2 and forms a first capacitor with the first diaphragm, and forms a second capacitor with second diaphragm M2.

First diaphragm M1 and second diaphragm M2 are designed in such a way that they are deformable toward one another (dashed lines) when acted on by external pressure PA, resulting in twice the change in capacitance compared to a single diaphragm when acted on by pressure, without significantly increasing the installation space.

Edge area R of diaphragm system M1, M2 is spaced apart from an edge area R' of surrounding sensor substrate SS via a spacing Z1.

Bond pad B1 is used to electrically contact first and second diaphragms M1, M2, which are electroconductively connected to one another, and bond pad B2 is used to electrically contact central electrode E1.

In this specific embodiment, base substrate S is conductively connected to first diaphragm M1; however, if desired, this connection may also take place in an electrically insulating manner by providing a further insulating area of first insulating layer O1.

Figure 2A:
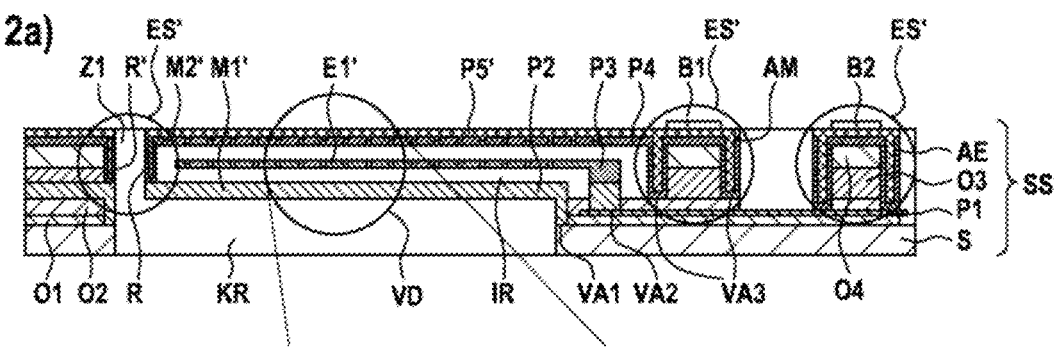
FIGS. 2a) and 2b) show schematic vertical cross-sectional illustrations of a micromechanical pressure sensor device according to a second specific embodiment of the present invention, FIG. 2b) showing an enlarged detail of FIG. 2a).
Figure 2B:
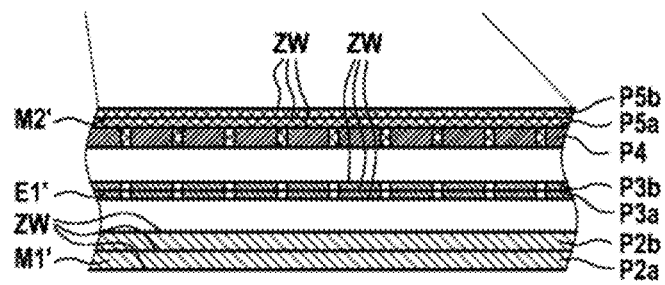

FIGS. 2a), 2b) are schematic vertical cross-sectional illustrations of a micromechanical pressure sensor device according to a second specific embodiment of the present invention, FIG. 2b) showing an enlarged detail of FIG. 2a).

In the second specific embodiment, in comparison to the first specific embodiment, modified etch stop structures ES' are provided which are formed, above first conductive layer P1, only from fourth and fifth conductive layers P4, P5. The feed line resistance between bond pad B2 and first conductive layer P1 may be reduced in this way. In principle, it is also possible to remove fifth conductive layer P5 below bond pad B2, so that only fourth conductive layer P4 is used as an electrical feed line path for first conductive layer P1.

In addition, the second specific embodiment differs from the first specific embodiment via the design of first diaphragm M1', second diaphragm M2', and central electrode E1'. In particular this is shown in FIG. 2b), which illustrates an enlarged detail of shown area VD from FIG. 2a).

First diaphragm M1' is formed from a conductive layer P2a and a conductive layer P2b, second diaphragm M2' is formed from fourth conductive layer P4, a further conductive layer P5a, and yet a further conductive layer P5b, and central electrode E1' is formed from a conductive layer P3a and a further conductive layer P3b.

Conductive layers P2a, P2b and P3a, P3b and P4, P5b, P5b are situated embedded between additional layers ZW or layer combinations which include, for example, silicon oxide, silicon nitride, silicon carbide, etc., and which contribute toward influencing the curvature of the individual layer stacks in order to create preferably planar layer stacks. To allow an electrical connection between adjacent conductive layers to be ensured, additional layers ZW may also be structured. The number of layers and layer combinations shown in FIG. 2b) is understood as an example, and is arbitrarily expandable.

Figure 3A:
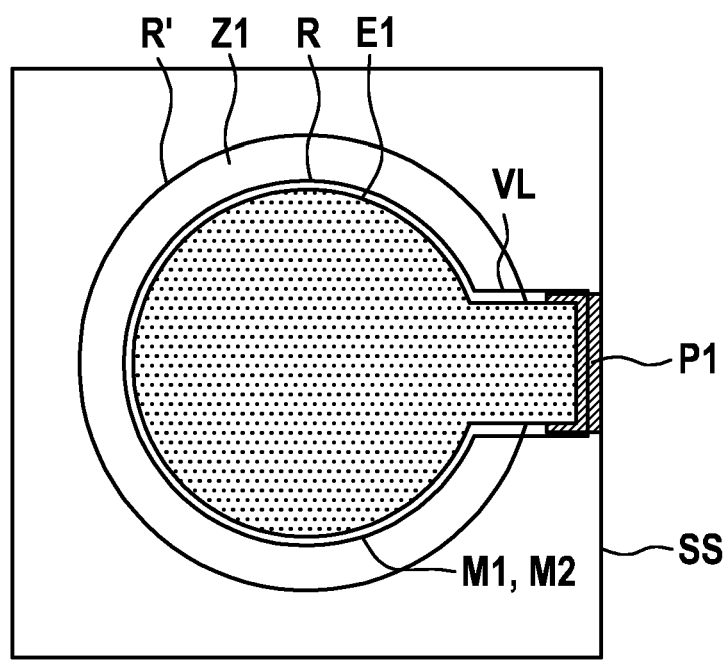
FIGS. 3a) through 3d) show schematic horizontal cross-sectional illustrations for explaining various anchoring variants of a micromechanical pressure sensor device according to specific example embodiments of the present invention.

FIGS. 3a) through 3d) are schematic horizontal cross-sectional illustrations for explaining various anchoring variants of a micromechanical pressure sensor device according to the described specific embodiments of the present invention.

In particular, FIGS. 3a) through 3d) illustrate a cross section of the particular central electrode E1, E1', E1''', or E1''''.

FIG. 3a) corresponds to the arrangement illustrated in FIG. 1k), the cylindrical socket-shaped diaphragm system being guided with first and second diaphragms M1, M2 and central electrode E1 across extension area VL at an angle to anchoring areas VA1, VA2, and VA3. This allows effective stress decoupling with respect to surrounding sensor substrate SS.

Figure 3B:
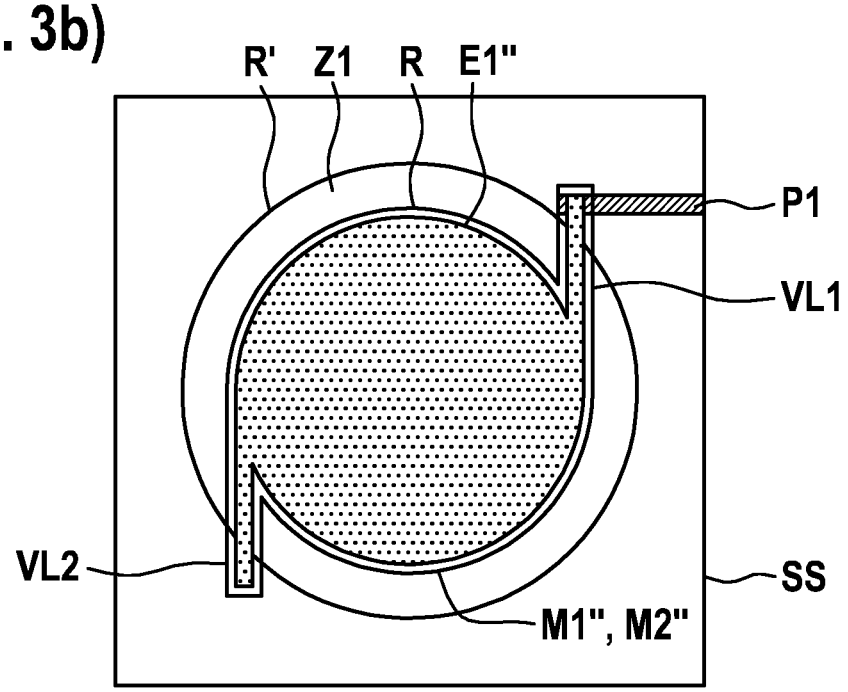

According to FIG. 3b), the diaphragm system likewise has a design according to FIG. 3a), except that a first extension area VL1 and a second extension area VL2 are provided which with first and second diaphragms M1', M2' extend tangentially away from the diaphragm system. Central electrode E1' also includes corresponding extensions. According to FIG. 3b), only extension area VL1 of central electrode E1' is electrically connected to first conductive layer P1. Extension areas VL1, VL2 are situated diametrically opposite one another.

The tangential connection of the diaphragm system to first and second diaphragms M1', M2' has the advantage that in the event of thermal expansion of anchorings VL1, VL2, only slight twisting of diaphragm system, but not stress coupling, may occur.

In the embodiment variant according to FIG. 3c), extension area VL1 of the diaphragm system including first and second diaphragms M1''', M2''' has the same design as extension area VL1 according to FIG. 3b), except that in extension area VL2, central electrode E1''' is not guided for anchoring, and instead the anchoring takes place via the layers of first and second diaphragms M1''', M2'''.

Lastly, in the fourth embodiment variant, extension area VL1 has the same design as that according to FIG. 3b), except that in comparison to FIG. 3b), central electrode E1'''' is interrupted and includes an electrically unconnected area VE, which may provide processing engineering advantages. Diaphragms M1'''', M2'''' are likewise suspended across extension areas VL1, VL2, as described in conjunction with FIG. 3a).

The number of tangential connections of the diaphragm system is not limited to anchorings VL1 and VL2 shown in FIGS. 3b) through 3d), and may include an arbitrary number.

Figure 4:
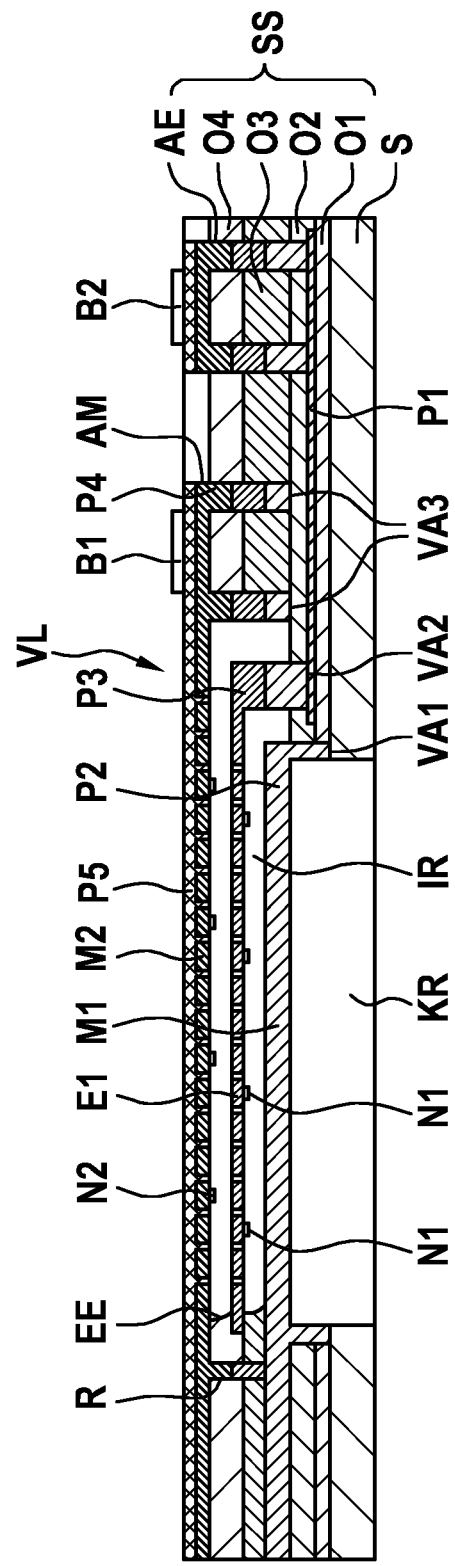
FIG. 4 shows a schematic vertical cross-sectional illustration of a micromechanical pressure sensor device according to a third specific embodiment of the present invention.

FIG. 4 is a schematic vertical cross-sectional illustration of a micromechanical pressure sensor device according to a third specific embodiment of the present invention.

The third specific embodiment differs from the first specific embodiment in that central electrode E1 is clamped in interior IR across a clamping area EE, i.e., is not suspended in a cantilever manner. Clamping area EE includes residues of etched third and fourth insulating layers O3, O4. In addition, edge area R of the diaphragm system including first and second diaphragms M1, M2 is not in a cantilever manner, but, rather, is closed due to omission of space Z1, so that in this specific embodiment, cavity KR is necessary in order for first diaphragm M1 to be acted on by external pressure PA. Via a suitable design of the pressure sensor chip, it is also possible for diaphragm M2 to be acted on by pressure PA in order to achieve a doubling of the pressure sensitivity.

In addition, knobs N1 are situated at the bottom side of central electrode E1, and second knobs N2 are situated at the bottom side of second diaphragm M2, which are intended to prevent sticking of first diaphragm M1 to central electrode E1 and sticking of second diaphragm M2 to central electrode E1.

Furthermore, in this specific embodiment, third and fourth insulating layers O3, O4 in the area of electrical connections AE, EM are not removed.

Otherwise, the third specific embodiment corresponds to the first specific embodiment described above.

Clamping area EE may extend circumferentially or partially. As the result of this clamping area, a relative movement between central electrode E1 and diaphragms M1, M2, for example due to an acceleration of the pressure sensor device, may be reduced.

For a circumferential design of clamping area EE, the pressure sensor device according to the third specific embodiment may also be operated as a differential pressure sensor (also see FIG. 6)).

Figure 5A:
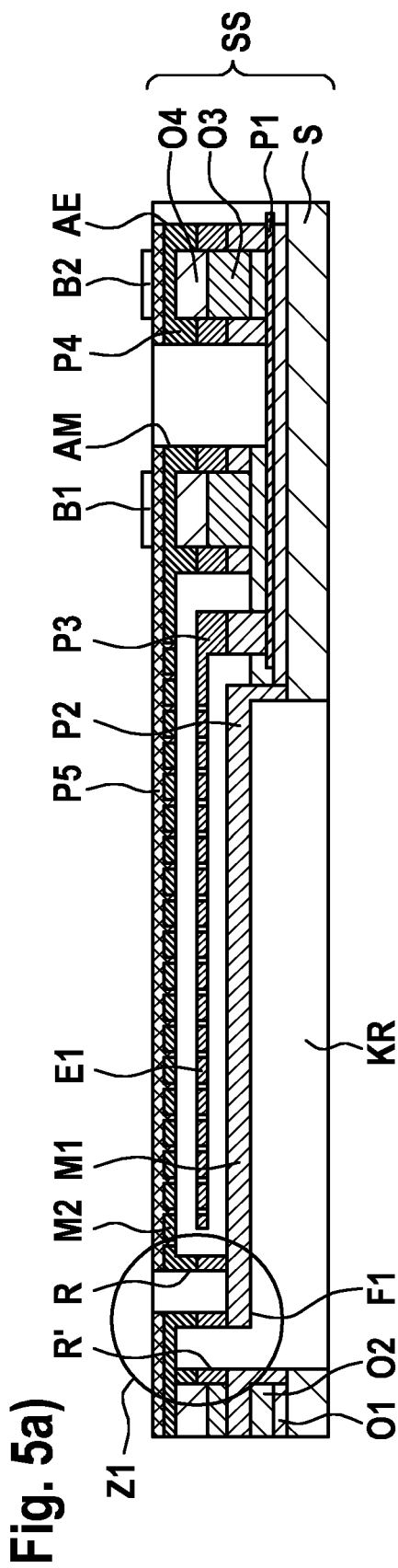
FIGS. 5a) through 5d) show schematic vertical cross-sectional illustrations for explaining various clamping variants of a micromechanical pressure sensor device according to the specific example embodiments of the present invention.

FIGS. 5a) through 5d) are schematic vertical cross-sectional illustrations for explaining various clamping variants of a micromechanical pressure sensor device according to the described specific embodiments of the present invention.

Figure 5B:
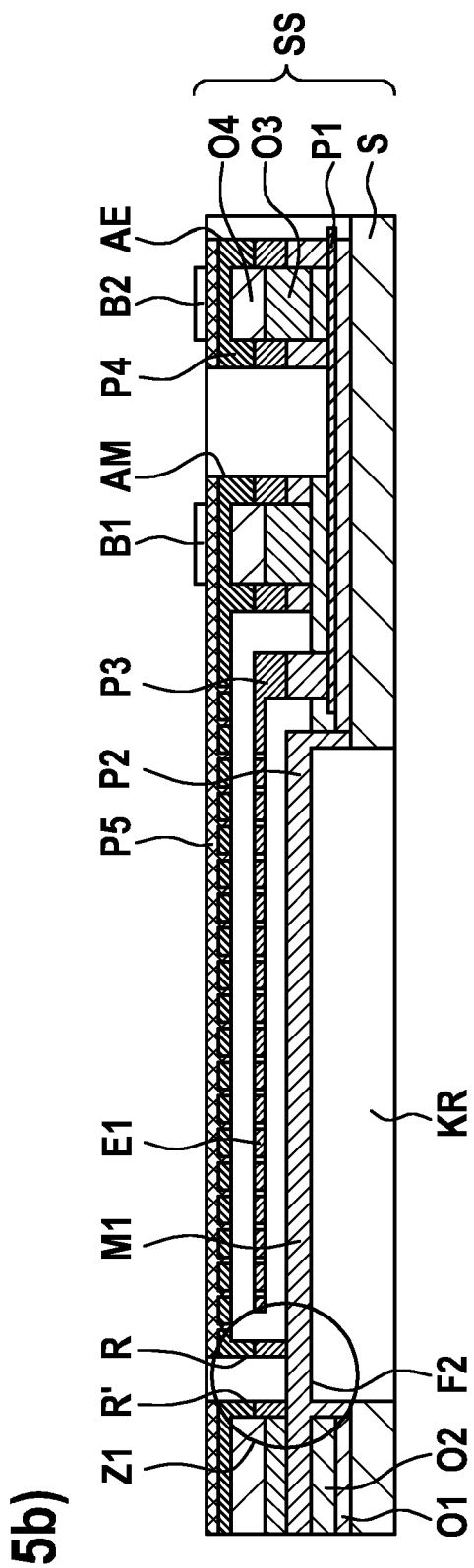

The illustrations in FIGS. 5a) through 5d) show that the diaphragm system including first and second diaphragms M1, M2 may be clamped either partially or circumferentially within spacing Z1 described above. An elastic spring device F1, F2, F3, or F4 is used in each case for the clamping. Spring device F1 according to FIG. 5a) has a stepped design, whereas spring device F2 according to FIG. 5b) is formed only by second conductive layer P2. Spring device F3 according to FIG. 5c) is formed by fourth and fifth conductive layers P4, P5, and spring device F4 according to FIG. 5d) is formed by third conductive layer P3.

Of course, combinations of illustrated spring devices F1 through F4 or other types of geometric designs are also possible.

Additional suitably structured etch stop structures as described above are necessary for manufacturing spring devices F1 through F4.

Since spring devices F1 through F4 are manufactured from polysilicon of conductive layers P1 through P5, an electrical connection of first and second diaphragms M1, M2 via these spring devices is also possible.

In addition, spring devices F1 through F4 may be connected/anchored to the diaphragm system at an arbitrary angle, and may be connected/anchored to the substrate that surrounds the diaphragm system, at an arbitrary angle.

FIG. 6 is a schematic vertical cross-sectional illustration of a micromechanical pressure sensor device according to a fourth specific embodiment of the present invention.

The micromechanical pressure sensor device according to FIG. 6 is based on the micromechanical pressure sensor device according to FIG. 4. In contrast thereto, edge area R''' of the diaphragm system including first and second diaphragms M1, M2 has an electrically insulating design, so that first diaphragm M1 and second diaphragm M2 are connected to one another in an electrically insulating manner and in addition are circumferentially clamped. In addition, central electrode E1 is clamped to third and fourth insulating layers O3, O4 across clamping area EE.

Also provided is a third bond pad B3 via which first diaphragm M1 is electrically contactable separately from second diaphragm M2. This pressure sensor device is thus configured as an absolute pressure sensor which may detect a pressure difference between a first external pressure PA and a second external pressure PA'. In this example, diaphragm M1 as well as substrate S are electrically contacted via third bond pad B3. Optionally, it is possible for diaphragm M1 to not be electrically connected to the substrate, but, rather, to have a design that is insulated from the substrate. In this way, substrate S and diaphragm M1 may be connected at different electrical potentials.

FIG. 7 is a schematic vertical cross-sectional illustration of a micromechanical pressure sensor device according to a fifth specific embodiment of the present invention.

In the specific embodiment according to FIG. 7, central electrode E1 is electrically contactable across second conductive layer P2 via electrical connection AE'. Second diaphragm M2 is electrically contactable across third, fourth, and fifth electrically conductive layers P3, P4, P5 via electrical connection AM' and is anchored to third insulating layer O3.

FIG. 8 is a schematic vertical cross-sectional illustration of a micromechanical pressure sensor device according to a sixth specific embodiment of the present invention.

In the sixth specific embodiment according to FIG. 8, central electrode E1 is electrically contactable across third, fourth, and fifth conductive layers P3, P4, P5 via electrical connection AE'', and second diaphragm M2 is electrically contactable via electrical connection AM'', which extends across fourth and fifth electrically conductive layers P4, P5.

It is likewise possible, not shown, to place electrical bond pad B2 directly on third conductive layer P3, which is used to electrically contact the central electrode.

Figure 9C:
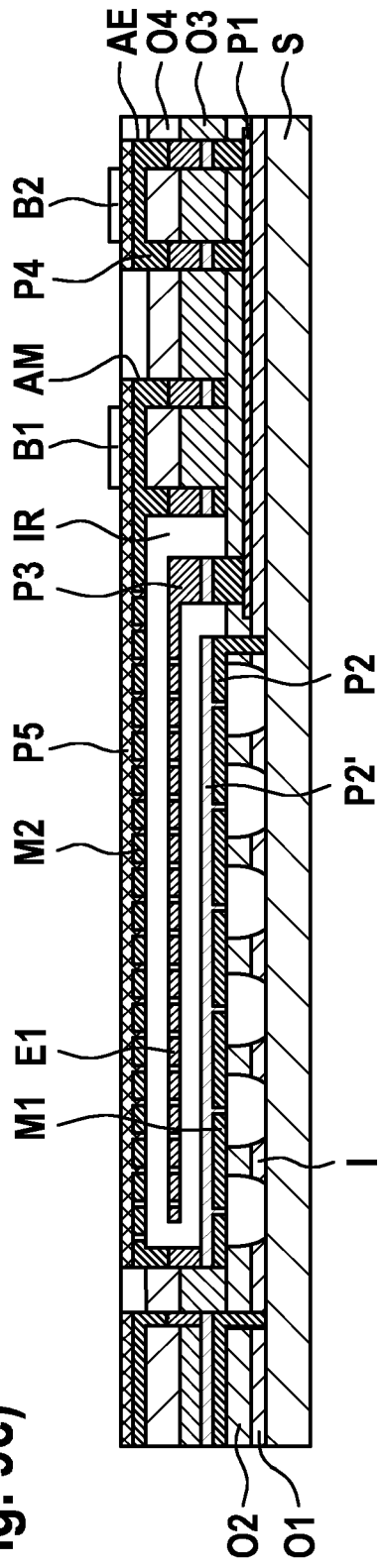
FIGS. 9a) through 9d) show schematic vertical cross-sectional illustrations for explaining a method for manufacturing a micromechanical pressure sensor device, and a corresponding micromechanical pressure sensor device according to a seventh specific embodiment of the present invention.
Figure 9D:
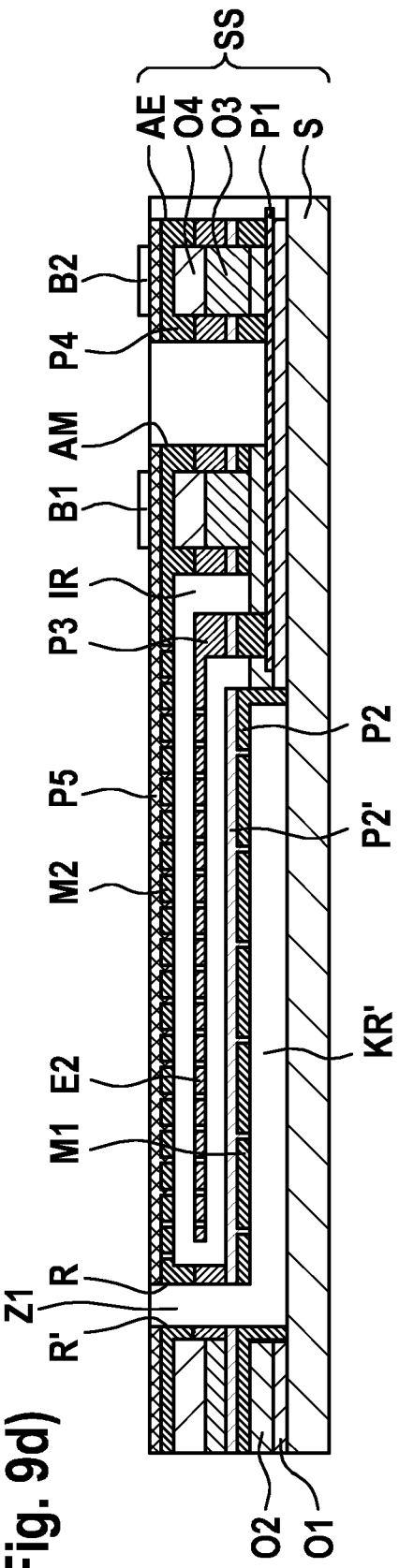

FIGS. 9a) through 9d) are schematic vertical cross-sectional illustrations for explaining a method for manufacturing a micromechanical pressure sensor device, and a corresponding micromechanical pressure sensor device according to a seventh specific embodiment of the present invention.

The above-described specific embodiments of micromechanical pressure sensor devices are described in such a way that they may be manufactured via bulk micromechanics. With few design and process changes, this basic design may also be used for manufacturing a capacitive surface micromechanical pressure sensor.

The surface micromechanical pressure sensor has the advantage that it is processed from only one side, which may prevent damage to the diaphragm system due to face-down processing, which occurs with bulk micromechanics. In a departure from the bulk micromechanics pressure sensor, in the surface micromechanical pressure sensor, second conductive layer P2 in the diaphragm area of diaphragm M1 is provided with through holes V10, and underlying first and second insulating layers O1, O2 are partially or completely removed by an etching process in an early process stage, using these etching holes V10.

This is shown in FIG. 9a), which corresponds to FIG. 1b) described above. With suitable placement of etching holes V10, it is possible to initially create local islands I in first and second insulating layers O1, O2. These islands I support first diaphragm M1 by large-surface bending during a subsequent process step, such as a polishing step (CMP). After islands I are formed, etching holes V10 are closed with the aid of a further conductive layer P2' made of polysilicon, for example, which likewise may optionally be thickened by further conductive layers, or epitaxially deposited silicon. To allow short circuits between first diaphragm M1 and base substrate S to be avoided, etching holes V10 should have preferably small lateral dimensions so that they may be quickly closed, or optionally, they may initially be closed with the aid of an insulating layer, for example silicon oxide or silicon nitride or combinations thereof, prior to depositing further conductive layer P2', and further conductive layer P2' may be subsequently applied with the aid of a PECVD layer deposition, an LPCVD layer deposition, or an epitaxial layer deposition, for example.

In the variant including the additional insulating layer, after the deposition the closure layer may also be structured in such a way that a subsequently deposited polysilicon layer completely encloses the sealing plugs on the diaphragm layer. This is shown as an alternative in FIG. 9b), the sealing plugs being denoted by reference symbol NP. Optionally, the sealing oxide may also be structured in such a way that contact holes are produced only at defined locations which allow electrical contacting between layers P2 and P2'. In addition, the insulating layer may also be structured in such a way that it is completely enclosed by electrically conductive layers P2 and P2'.

Subsequently, the layer depositions and structurings explained above now take place according to FIGS. 9c) and 9d). After structuring of upper second diaphragm M2, in the surface micromechanical variant the diaphragm system is now exposed by removing first through fourth insulating layers O1 through O4 in areas, as explained above. As a result of silicon islands I made of silicon oxide, created at the beginning for stabilizing first diaphragm M1, it is now also possible to quickly penetrate first and second insulating layers O1, O2 to be removed beneath first diaphragm M1, using a suitable etching medium. Here as well, well-defined insulating areas may be removed with the aid of lateral etch stop structures ES (see FIG. 1j)).

In this specific embodiment, cavity KR' that results below first diaphragm M1 is not open toward the rear side of base substrate S.

FIG. 10 is a schematic vertical cross-sectional illustration of a micromechanical pressure sensor device according to an eighth specific embodiment of the present invention.

Since with wet chemical etching there is a risk that the exposed diaphragm structure across first diaphragm M1 may flatly adhere to underlying base substrate S, in the eighth specific embodiment, with a suitable design layout of first conductive layer P1 and second insulating layer O2, stops may optionally be produced at the bottom side of first diaphragm M1, as illustrated in FIG. 10 and denoted by reference symbol N3.

In the variant without a first conductive layer P1 (see FIGS. 7 and 8), these stops may also be created, for example, by timed etching in second insulating layer O2.

Also in the surface micromechanical variant, all options concerning design and process configuration already described in the bulk micromechanics variant are possible. Since in the surface micromechanical variant the subsequently separated pressure sensor chip includes no cavity at the rear side, it is possibly here to flatly glue on the pressure sensor chip.

FIG. 11 is a schematic vertical cross-sectional illustration of a micromechanical pressure sensor device according to a ninth specific embodiment of the present invention.

In the specific embodiment according to FIG. 11, first diaphragm M1, in comparison to the eighth specific embodiment according to FIG. 10, is connected to central electrode E1 via electrically insulating connecting areas VK of third insulating layer O3.

When first diaphragm M1 is acted on by external pressure PA, central electrode E1 together with first diaphragm M1 may thus be deformed, as the result of which a reference capacitor CR1 is formed. Optionally, a reference capacitor CR1 may also be formed in that electrically insulating connecting areas VK of fourth insulating layer O4 are situated between central electrode E1 and diaphragm M2 and mechanically connect same.

Figure 12:
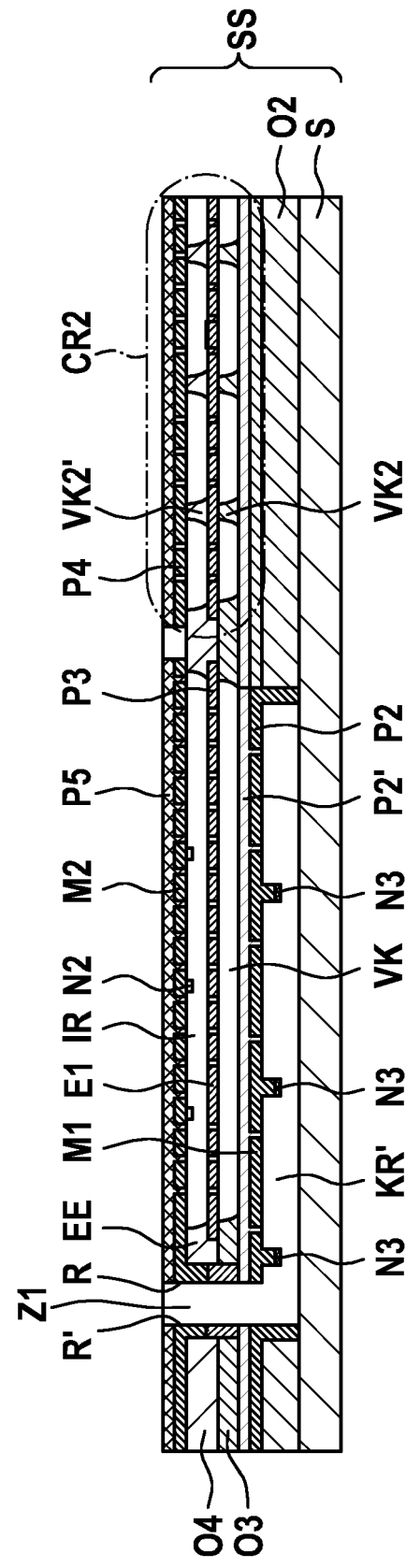
FIG. 12 shows a schematic vertical cross-sectional illustration of a micromechanical pressure sensor device according to a tenth specific embodiment of the present invention.

FIG. 12 is a schematic vertical cross-sectional illustration of a micromechanical pressure sensor device according to a tenth specific embodiment of the present invention.

In the specific embodiment according to FIG. 12, a separate reference capacitor CR2 is formed in sensor substrate SS, laterally spaced apart from the diaphragm system including first and second diaphragms M1, M2. This reference capacitor includes conductive layers P2, P2' of first diaphragm M1, third conductive layer P3 of central electrode E1, and fourth and fifth conductive layers P4, P5 of second diaphragm M2, as well as connecting areas VK2 from third insulating layer O3 and connecting areas VK2' from fourth insulating layer O4, which are formed in each case between the capacitor plates for stabilization and fixing. Optionally, a reference capacitor may also be formed here in such a way that only connecting areas VK2 or only connecting areas VK2' are produced. If only connecting area VK2 is produced, layer P3 of central electrode E1 and layers P2, P2' of diaphragm M1 form a reference capacitor. If only connecting area VK2' is produced, layer P3 of central electrode E1 and layers P4, P5 of diaphragm M2 form a reference capacitor. A further option for implementing a reference capacitor is to provide no connecting areas VK2, VK2'. If fourth and fifth conductive layers P4, P5 of second diaphragm M2 are not mechanically coupled to third conductive layer P3 of central electrode E1, a pressure PA that is present at fourth and fifth conductive layers P4, P5 causes deformation of only these layers, but not of third conductive layer P3 of central electrode E1. Thus, upon action of pressure by a pressure PA, the distance between layer P3 of central electrode E1 and layers P2, P2' of diaphragm 1 does not change. A reference capacitor CR2 may thus be formed in sensor substrate SS, even without connecting areas VK2, VK2'. Although the present invention has been described based on preferred exemplary embodiments, it is not limited thereto. In particular, the stated materials and topologies are only by way of example and are not limited to the described examples.

Although not described in the specific embodiments discussed above, a planarization of the substrate surface may take place with the aid of a polishing step (a CMP polishing step, for example) after each described layer deposition. In addition, it is possible to dope or implant the deposited conductive layers made of polysilicon or the like in order to improve their electrical conductivity. Such doping may take place here, for example, after the layer deposition or in situ during the layer deposition.

The pressure sensor devices described here are based on the use of silicon layers for the diaphragm structure and electrode structure. In principle, it is also possible to implement these structures with the aid of metallic layers or other conductive layers.

In the pressure sensor devices described here, the lateral etch stop structures are made up of electrically conductive layers such as polysilicon. In terms of process engineering, it is optionally possible to also form these lateral etch stop structures from electrically insulating layers or from layered sequences of polysilicon and insulating layers. It is also possible to simultaneously use electrically conductive etch stop structures and electrically insulating etch stop structures on a sensor chip. In selecting the insulating layers, it must be ensured that they are chemically resistant to the etching processes via which insulating layers O1, O2, O3, O4 are locally removed. If insulating layers O1, O2, O3, O4 are made of silicon oxide, for example, insulating layers made of, for example, silicon carbide, silicon nitride, and here in particular silicon-rich silicon nitride, have proven suitable for use in etch stop structures.

Although the extension areas extend tangentially away from the diaphragm system in one example above, it is possible for the extension areas to extend away from the diaphragm system at an arbitrary angle, or also to extend away from the surrounding sensor substrate at an arbitrary angle.

It is possible to form a reference capacitor in particular between the central electrode and the first diaphragm. A reference capacitor may also be formed when electrically insulating connecting areas are provided between the central electrode and the second diaphragm. In addition, the first diaphragm as well as the second diaphragm may be coupled to the central electrode with the aid of connecting areas.

What is claimed is:

1. A micromechanical pressure sensor device, comprising:
a sensor substrate;
a diaphragm system that is anchored in the sensor substrate and that includes a first diaphragm and a second diaphragm situated spaced apart therefrom, which are circumferentially connected to one another in an edge area, and enclose a reference pressure in an interior space formed in between the first and second diaphragm; and
a plate-shaped central electrode that is suspended in the interior space and that is situated spaced apart from the first diaphragm and from the second diaphragm and that forms a first capacitor with the first diaphragm and forms a second capacitor with the second diaphragm;
wherein the first diaphragm and the second diaphragm are configured in such a way that they are deformable toward one another when acted on by an external pressure,
wherein the diaphragm system is situated in a cantilever manner.

2. The micromechanical pressure sensor device as recited in claim 1, wherein the diaphragm system at the edge area is clamped in the sensor substrate via at least one elastic spring device.

3. The micromechanical pressure sensor device as recited in claim 1, wherein the first diaphragm and the second diaphragm are electroconductively connected to one another via the edge area.

4. The micromechanical pressure sensor device as recited in claim 1, wherein the first diaphragm and the second diaphragm are electrically insulatingly connected to one another via the edge area.

5. The micromechanical pressure sensor device as recited in claim 1, wherein the first diaphragm is exposed to outside toward a first side or toward a second side of the sensor substrate via a cavity, and the second diaphragm is exposed to the outside toward the second side of the sensor substrate.

6. The micromechanical pressure sensor device as recited in claim 1, wherein the first diaphragm is connected to the central electrode across electrically insulating connecting areas, so that when the first diaphragm is acted on by the external pressure, the central electrode together with the first diaphragm is deformable, and a reference capacitor is formed.

7. The micromechanical pressure sensor device as recited in claim 1, wherein a separate reference capacitor is formed in the sensor substrate, laterally spaced apart from the diaphragm system.

8. A micromechanical pressure sensor device, comprising:
a sensor substrate;
a diaphragm system that is anchored in the sensor substrate and that includes a first diaphragm and a second diaphragm situated spaced apart therefrom, which are circumferentially connected to one another in an edge area, and enclose a reference pressure in an interior space formed in between the first and second diaphragm; and
a plate-shaped central electrode that is suspended in the interior space and that is situated spaced apart from the first diaphragm and from the second diaphragm and that forms a first capacitor with the first diaphragm and forms a second capacitor with the second diaphragm;
wherein the first diaphragm and the second diaphragm are configured in such a way that they are deformable toward one another when acted on by an external pressure,
wherein the diaphragm system is situated in a cantilever manner, and is anchored in the sensor substrate across at least one extension area that extends laterally away from the diaphragm system.

9. The micromechanical pressure sensor device as recited in claim 8, wherein the diaphragm system has a cylindrical configuration, and a first extension area and a second extension area are provided which extend tangentially and laterally away from the diaphragm system and are situated diametrically opposite one another.

10. The micromechanical pressure sensor device as recited in claim 8, wherein the central electrode is situated in a cantilever manner and is anchored in the sensor substrate across the at least one extension area.

11. The micromechanical pressure sensor device as recited in claim 8, wherein the central electrode is clamped, at least in areas, in the interior space across a clamping area.

12. A method for manufacturing a micromechanical pressure sensor device, comprising the following steps:
forming a diaphragm system that is anchored in a sensor substrate, and includes a first diaphragm and a second diaphragm situated spaced apart from one another and which are circumferentially connected to one another in an edge area and enclose a reference pressure in an interior space formed in between the first and second diaphragms; and
forming a plate-shaped electrode central electrode that is suspended in the interior space and that is situated spaced apart from the first diaphragm and from the second diaphragm, and that forms a first capacitor with the first diaphragm and forms a second capacitor with the second diaphragm, the first diaphragm and the second diaphragm being formed in such a way that they are deformable toward one another when acted on by an external pressure,
wherein the diaphragm system is situated in a cantilever manner.

13. A method for manufacturing a micromechanical pressure sensor device, comprising the following steps:
forming a diaphragm system that is anchored in a sensor substrate, and includes a first diaphragm and a second diaphragm situated spaced apart from one another and which are circumferentially connected to one another in an edge area and enclose a reference pressure in an interior space formed in between the first and second diaphragms; and forming a plate-shaped electrode central electrode that is suspended in the interior space and that is situated spaced apart from the first diaphragm and from the second diaphragm, and that forms a first capacitor with the first and forms a second capacitor with the second diaphragm, the first diaphragm and the second diaphragm being formed in such a way that they are deformable toward one another when acted on by an external pressure, wherein the first diaphragm is formed from a first conductive layer that is deposited and structured above a base substrate, the central electrode being formed from a second conductive layer that is deposited and structured above the first conductive layer, and the second diaphragm being formed from third and fourth conductive layers that are deposited and structured above the second conductive layer.

14. The method as recited in claim 13, wherein the interior space is formed by depositing and structuring a first sacrificial layer in the interior space between the first conductive layer and the second conductive layer, depositing and structuring a second sacrificial layer, and carrying out a sacrificial layer etching process for at least partially removing the first sacrificial layer and the second sacrificial layer after perforation of the third conductive layer in the interior space, after which the third conductive layer is closed by deposition of the fourth conductive layer.

15. A method for manufacturing a micromechanical pressure sensor device, comprising the following steps:

forming a diaphragm system that is anchored in a sensor substrate, and includes a first diaphragm and a second diaphragm situated spaced apart from one another and which are circumferentially connected to one another in an edge area and enclose a reference pressure in an interior space formed in between the first and second diaphragms; and forming a plate-shaped electrode central electrode that is suspended in the interior space and that is situated spaced apart from the first diaphragm and from the second diaphragm, and that forms a first capacitor with the first and forms a second capacitor with the second diaphragm, the first diaphragm and the second diaphragm being formed in such a way that they are deformable toward one another when acted on by an external pressure, wherein a space is formed between the diaphragm system and an edge area of a surrounding sensor substrate, so that the diaphragm system is situated in a cantilever manner.

* * * * *